US011781236B2

(12) United States Patent
Sato et al.

(10) Patent No.: US 11,781,236 B2
(45) Date of Patent: Oct. 10, 2023

(54) COMPOSITE COPPER FOIL

(71) Applicant: NAMICS CORPORATION, Niigata (JP)

(72) Inventors: Makiko Sato, Niigata (JP); Osamu Suzuki, Niigata (JP); Naoki Obata, Niigata (JP); Yoshinobu Kokaji, Niigata (JP)

(73) Assignee: NAMICS CORPORATION, Niigata (JP)

( * ) Notice: Subject to any disclaimer, the term of this patent is extended or adjusted under 35 U.S.C. 154(b) by 380 days.

(21) Appl. No.: 16/762,587

(22) PCT Filed: Nov. 9, 2018

(86) PCT No.: PCT/JP2018/041705

§ 371 (c)(1),
(2) Date: May 8, 2020

(87) PCT Pub. No.: WO2019/093494

PCT Pub. Date: May 16, 2019

(65) Prior Publication Data

US 2020/0332431 A1 Oct. 22, 2020

(30) Foreign Application Priority Data

Nov. 10, 2017 (JP) ................................. 2017-217777
Mar. 30, 2018 (JP) ................................. 2018-069608

(51) Int. Cl.
*C25D 7/06* (2006.01)
*C23C 18/18* (2006.01)
(Continued)

(52) U.S. Cl.
CPC ................ *C25D 7/06* (2013.01); *C23C 18/18* (2013.01); *C23C 22/52* (2013.01); *C25D 5/34* (2013.01);
(Continued)

(58) Field of Classification Search
None
See application file for complete search history.

(56) References Cited

U.S. PATENT DOCUMENTS 5,569,545 A 10/1996 Yokono et al.
5,885,436 A 3/1999 Ameen et al.
(Continued)

FOREIGN PATENT DOCUMENTS

CN 1860832 A 11/2006
EP 0896502 A1 2/1999
(Continued)

OTHER PUBLICATIONS

Machine translation of WO 2015040998 A1 via EPO. Translated Jul. 15, 2022. (Year: 2015).*

*Primary Examiner* — Elizabeth Collister
(74) *Attorney, Agent, or Firm* — Clark & Elbing LLP

(57) ABSTRACT

[Problem] An object is to provide novel composite copper foils. [Means to solve the problem] A composite copper foil comprises a copper foil and a layer of metal other than copper, the metal layer being formed on at least a part of a surface of the copper foil, wherein at least a part of the composite copper foil has protrusions on a surface thereof, and each protrusion has a height of 10 nm or more but 1000 nm or less in a cross-section of the composite copper foil.

10 Claims, 1 Drawing Sheet

(51) Int. Cl.

| | |
|---|---|
| ***C23C 22/52*** | (2006.01) |
| ***C25D 5/34*** | (2006.01) |
| ***H05K 1/09*** | (2006.01) |
| ***H05K 3/38*** | (2006.01) |

(52) U.S. Cl.

CPC ............... *H05K 1/09* (2013.01); *H05K 3/384* (2013.01); *H05K 3/385* (2013.01)

(56) References Cited

U.S. PATENT DOCUMENTS

| | | | | |
|---|---|---|---|---|
| 2005/0067378 | A1 | 3/2005 | Fuerhaupter et al. | |
| 2012/0061698 | A1 | 3/2012 | Toscano et al. | |
| 2012/0125514 | A1 | 5/2012 | Wei et al. | |
| 2012/0148862 | A1 * | 6/2012 | Moriyama ............. | H05K 3/384 428/607 |
| 2012/0285734 | A1 * | 11/2012 | Uno ....................... | H05K 3/384 174/257 |
| 2013/0026134 | A1 | 1/2013 | Nakagawa et al. | |
| 2014/0091058 | A1 | 4/2014 | Nakagawa et al. | |
| 2017/0027065 | A1 | 1/2017 | Wei et al. | |

FOREIGN PATENT DOCUMENTS

| | | | | |
|---|---|---|---|---|
| JP | H07-38254 | A | 2/1995 | |
| JP | H07-314603 | A | 12/1995 | |
| JP | H08-097559 | A | 4/1996 | |
| JP | 2000-151096 | A | 5/2000 | |
| JP | 2007-291448 | A | 11/2007 | |
| JP | 2013-534054 | A | 8/2013 | |
| KR | 10-2016-0060046 | A | 5/2016 | |
| TW | 406137 | B | 9/2000 | |
| TW | I448539 | B | 8/2014 | |
| TW | I479049 | B | 4/2015 | |
| WO | WO-2014/126193 | A1 | 8/2014 | |
| WO | WO-2015040998 | A1 * | 3/2015 | ............. C23C 22/52 |

* cited by examiner

| | EXAMPLE 2 | EXAMPLE 3 | EXAMPLE 4 |
|---|---|---|---|
| CROSS -SECTION X30000 | 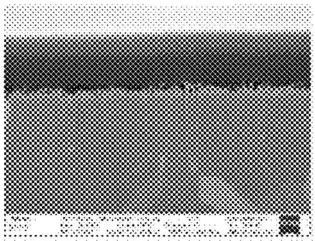 | 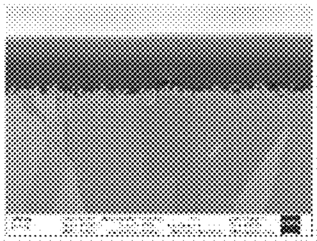 | 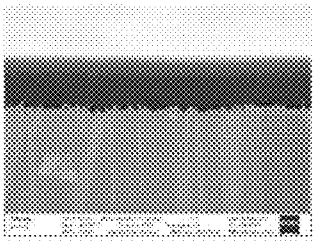 |
| CROSS -SECTION X50000 | 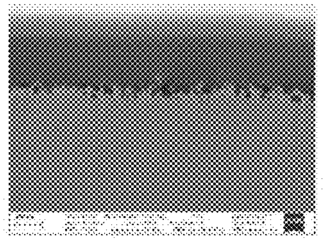 |  | 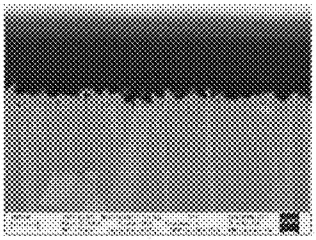 |
| | EXAMPLE 5 | EXAMPLE 6 | EXAMPLE 7 |
|---|---|---|---|
| CROSS -SECTION X30000 | 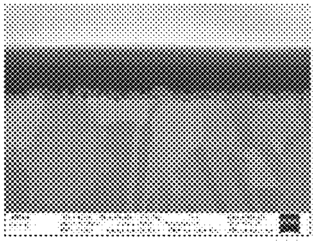 | 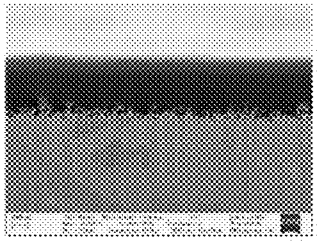 | 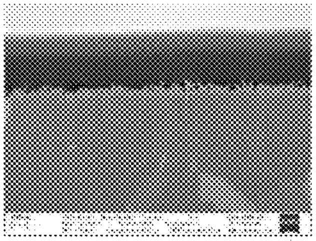 |
| CROSS -SECTION X50000 | 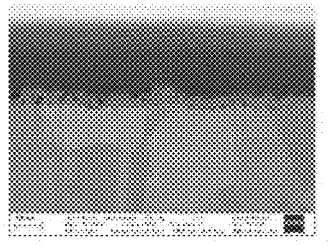 | 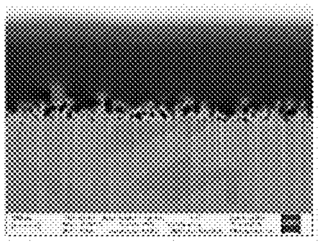 | 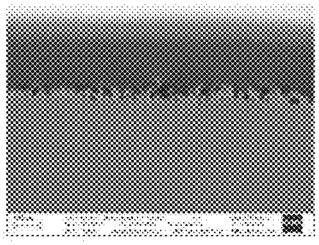 |
| | COMPARATIVE EXAMPLE 1 | COMPARATIVE EXAMPLE 2 |
|---|---|---|
| CROSS -SECTION X30000 | 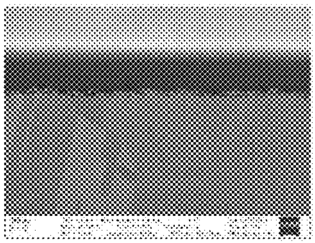 | 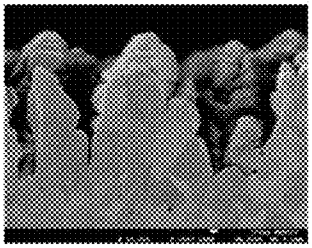 |
| CROSS -SECTION X50000 | 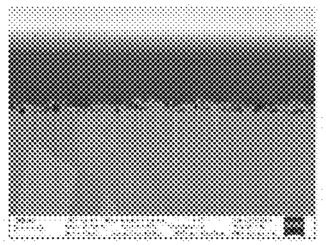 | 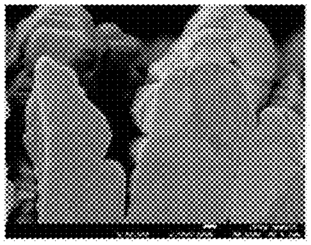 |

COMPOSITE COPPER FOIL

CROSS-REFERENCE TO RELATED APPLICATIONS

The present application claims priority to Japanese Patent Application No. 2017-217777 filed on Nov. 10, 2017 and Japanese Patent Application No. 2018-069608 filed on Mar. 30, 2018 which are incorporated herein by reference.

TECHNICAL FIELD

The present invention relates to composite copper foils.

BACKGROUND ART

Copper foils used for printed wiring boards are required to have a property of tight adhesion to resins. To enhance the property of adhesion, the methods of roughening the surfaces of copper foils by, for example, etching to enhance their physical adhesive strength have been used. The trend towards more integrated printed wiring boards, however, has led to demands for copper foils with smoother surfaces. In order to satisfy these conflicting requirements, a copper-surface treatment method involving, for example, oxidation and reduction steps has been developed (WO2014/126193). According to this method, protrusions and depressions of the copper oxide are formed by subjecting a copper foil to preconditioning and immersing it in a chemical solution containing an oxidizing agent to oxidize its surface, and then the surface roughness is adjusted by immersing the copper foil in a chemical solution containing a reducing agent to reduce the copper oxide to adjust the protrusions and depressions on its surface. Furthermore, in the treatment of copper foils using oxidation and reduction, other methods of improving their property of tight adhesion, including a method of adding surface-active molecules in the oxidation step (JP-T-2013-534054) and a method of forming a protective film on the surface of a copper foil using an aminothiazole compound after the reduction step (JP-A-8-97559) have been developed. Moreover, a method of forming, by plating, a film having discretely distributed metal particles on the surface of a copper conductor pattern on an insulation substrate, which has been roughened and on which a layer of copper oxide has been formed (JP-A-2000-151096) has been developed.

SUMMARY OF THE INVENTION

Problems to be Solved by the Invention

An object of the present invention is to provide novel composite copper foils.

Means to Solve the Problems

An aspect of the present invention is a composite copper foil including a copper foil and a layer of metal other than copper, wherein at least a part of the composite copper foil has protrusions on a surface thereof, and each protrusion has a height of 10 nm or more but 1000 nm or less in a cross-section of the composite copper foil. The height of each protrusion may be measured as a distance between a midpoint of a line segment connecting the lowest points of depressions on both sides of a given protrusion and the highest point of the protrusion, in a scanning electron microscope image of a cross-section. A percentage of Cu relative to the total weight of metal at a depth of 6 nm may be 80% or less and a percentage of Cu relative to the total weight of metal at a depth with no oxygen may be 90% or more. Each protrusion may have a height of 50 nm or more but 500 nm or less. The number of protrusions with a height of 50 nm or more may be, on average, 15 or more and 100 or less per a 3.8-μm range of a cross-section of the composite copper foil. The layer of metal may be a uniform layer with no particles. A Cu/O ratio at a depth where the atomic percentage of Cu is 40% may be 0.9 or more. The metal other than copper may be at least one metal selected from the group consisting of Sn, Ag, Zn, Al, Ti, Bi, Cr, Fe, Co, Ni, Pd, Au, and Pt.

Another aspect of the present invention is a method of manufacturing a composite copper foil including: a first step of oxidizing a surface of a copper foil; and a second step of plating the oxidized surface. Alkaline treatment may be performed using an alkaline aqueous solution before the first step. The oxidized surface of the copper foil may be melted with a malting agent in the first step. The plating in the second step may be electroless plating using a catalyst. The plating in the second step may be electrolytic plating.

BRIEF DESCRIPTION OF THE DRAWINGS

FIG. 1 shows scanning electron microscope (SEM) images showing cross-sections of composite copper foils of Examples 2 to 7 and Comparative Examples 1 and 2 of the present invention.

DETAILED DESCRIPTION OF THE INVENTION

Hereinafter, embodiments of the present invention are described in detail along with examples. The objects, features, advantages, and ideas of the present invention are apparent to those skilled in the art from the description of this specification. Those skilled in the art can easily reproduce the present invention from the description herein. The embodiments and specific examples described below represent preferable aspects of the present invention, which are given for the purpose of illustration or explanation. The present invention is not limited thereto. It is obvious to those skilled in the art that various modifications may be made according to the description of the present specification within the spirit and scope of the present invention disclosed herein.

==Composite Copper Foils==

An embodiment of the present invention is a composite copper foil having a copper foil and a layer of metal other than copper, the layer of metal being formed on at least a part of the surface of the copper foil. The composite copper foil has protrusions on at least a part of the surface of the layer of metal.

The average height of the protrusions is preferably 10 nm or higher, more preferably 50 nm or higher, and yet more preferably 100 nm or higher, but preferably 1000 nm or lower, more preferably 500 nm or lower, and yet more preferably 200 nm or lower. The height of each protrusion can be determined as, for example, a distance between the midpoint of a line segment connecting the lowest points of depressions adjacent to a given protrusion and the highest point of the protrusion between the depressions, in a scanning electron microscope (SEM) image of a cross-section of a composite copper foil produced with a focused ion beam (FIB).

The surface of a composite copper foil preferably includes, on average per a 3.8-μm range, 15 or more protrusions with a height of 50 nm or more, more preferably 30 or more protrusions, and yet more preferably 50 or more protrusions but preferably 100 or less protrusions, more preferably 80 or less protrusions, and yet more preferably 60 or less protrusions. The number of protrusions can be determined by counting the protrusions with a height of 50 nm or higher per a 3.8-μm range in a scanning electron microscope (SEM) image of a cross-section of a composite copper foil produced with a focused ion beam (FIB). The height can be measured as described above.

The kind of the metal other than copper is not limited but is preferably at least one metal selected from the group consisting of Sn, Ag, Zn, Al, Ti, Bi, Cr, Fe, Co, Ni, Pd, Au, and Pt.

The thickness of the layer of metal other than copper is not limited but is preferably 6 nm or more, more preferably 10 nm or more, and yet more preferably 14 nm or more.

The percentage of metal in the layer of metal other than copper is not particularly limited. Percentage of Cu relative to the total weight of metal at a depth of 6 nm is preferably 80% by weight or less, more preferably 50% by weight or less, and more preferably 30% by weight or less. Furthermore, the percentage of Cu relative to the total weight of metal at a depth with no oxygen is preferably 90% or more by weight, more preferably 95% or more by weight, and yet more preferably 99% or more by weight. Moreover, the Cu/O ratio at a depth where the atomic percentage of Cu is 40% is preferably 0.9 or more, more preferably 2 or more, and yet more preferably 5 or more. The percentage of Cu relative to the total weight of metal at a given depth can be measured using, for example, ion sputtering and X-ray photoelectron spectroscopy (XPS).

The layer of metal is preferably a uniform layer without particles. Here, the term "uniform" indicates that the thickness of the layer on 95% or more, preferably 98% or more, and more preferably 99% or more of the surface is not more than 5 times, preferably, 3 times, and more preferably, 2 times of the mean thickness of the layer. By forming a uniform metal layer without particles, the property of tight adhesion after heat treatment can be enhanced.

This composite copper foil can be used as a copper foil for printed wiring boards. Specifically, a laminated board can be manufactured by adhering a composite copper foil to a resin in a layered manner and can be used to manufacture a printed wiring board. Moreover, this composite copper foil can be used as a current collector in a secondary battery. Specifically, a slurry containing an active material such as graphite and a binder resin such as polyvinylidene fluoride is applied to a composite copper foil and dried to make an electrode, which can be used to manufacture a secondary battery.

The composite copper foil as described above has the advantage of having a good property of tight adhesion and good heat resistance although its roughness is not so high.

==Method of Manufacturing Composite Copper Foils==

An embodiment of the present invention is a method of manufacturing a composite copper foil, including a first step of oxidizing the surface of a copper foil and a second step of plating the oxidized copper surface.

First, the copper surface is oxidized with an oxidizing agent in the first step to form a layer of copper oxide as well as to form protrusions and depressions on the surface. A roughening step such as etching is not necessary before the oxidation step, but it may be performed. Alkaline treatment for preventing acids from being carried over to the degreasing-cleaning or oxidation step may be performed. The method for the alkaline treatment is not particularly limited, but a treatment at 30 to 50° C. from 0.5 to 2 minutes with preferably 0.1 to 10 g/L and more preferably 1 to 2 g/L of an alkaline aqueous solution such as an aqueous solution of sodium hydroxide will suffice.

The oxidizing agent is not limited but an aqueous solution of sodium chlorite, sodium hypochlorite, potassium chlorate, or potassium perchlorate can be used. One or more different kinds of additives (e.g., phosphates such as trisodium phosphate dodecahydrate) and/or surface-active molecules may be added to the oxidizing agent. Examples of the surface-active molecules include porphyrin, porphyrin macrocycles, expanded porphyrins, subporphyrins, linear porphyrin polymers, porphyrin sandwich complexes, porphyrin arrangements, silane, tetraorgano-silane, aminoethyl-aminopropyl-trimethoxysilane, (3-aminopropyl)trimethoxysilane, (1-[3-(trimethoxysilyl)propyl]urea)(1-[3-(trimethoxysilyl) propyl]urea)), (3-aminopropyl)triethoxysilane, ((3-glycidyloxypropyl)trimethoxysilane), (3-chloropropyl) trimethoxysilane, (3-glycidyloxypropyl)trimethoxysilane, dimethyldichlorosilane, 3-(trimethoxysilyl)propyl methacrylate, ethyl triacetoxysilane, triethoxy(isobutyl)silane, triethoxy(octyl)silane, tris(2-methoxyethoxy)(vinyl)silane, chlorotrimethylsilane, methyltrichlorosilane, silicon tetrachloride, tetraethoxysilane, phenyltrimethoxysilane, chlorotriethoxysilane, ethylene-trimethoxysilane, amines, and sugars.

The oxidation reaction conditions are not particularly limited but the liquid temperature of the oxidizing agent is preferably between 40 and 95° C., and more preferably between 45 and 80° C. The reaction time is preferably between 0.5 and 30 minutes and more preferably between 1 and 10 minutes.

In the first step, the protrusions and depressions of the oxidized copper foil surface may be adjusted by melting the oxidized surface of the copper foil with a melting agent.

The melting agent used in this step is not limited, but is preferably a chelating agent, in particular, a biodegradable chelating agent. Exemplified are ethylenediaminetetraacetic acid, diethanolglycine, L-glutamic acid diacetic acid tetrasodium, ethylenediamine-N,N'-disuccinic acid, sodium 3-hydroxy-2,2'-iminodisuccinate, trisodium methylglycine diacetate, tetrasodium aspartate diacetate, disodium N-(2-hydroxyethyl)iminodiacetate, and sodium gluconate.

The pH of the melting agent is not limited, but is preferably alkaline, more preferably is between 8 and 10.5, still more preferably is between 9.0 and 10.5, and yet more preferably, is between 9.8 and 10.2.

In this step, the copper surface is treated until the copper oxide melt rate becomes between 35 and 99%, preferably between 77 and 99% and the CuO thickness becomes between 4 and 150 nm, preferably between 8 and 50 nm. In these ranges, the peel strength for pre-pregs is increased, and uneven processing is reduced.

Next, in the second step, a composite copper foil is manufactured by plating the copper oxide layer with a metal other than copper. Plating can be performed using a known technique. For example, as a metal other than copper, Sn, Ag, Zn, Al, Ti, Bi, Cr, Fe, Co, Ni, Pd, Au, Pt, or various alloys can be used. The plating process is not particularly limited, and can be performed by electrolytic plating, electroless plating, vacuum deposition, chemical conversion treatment, etc.

In the case of electroless nickel plating, it is preferred to perform the treatment using a catalyst. As the catalyst, it is preferred to use iron, cobalt, nickel, ruthenium, rhodium, palladium, osmium, iridium or salts thereof. By performing the treatment using a catalyst, a uniform metal layer without discrete particles can be obtained. This enhances the heat resistance of the composite copper foil. In the case of electroless nickel plating, it is preferred to use a reducing agent to which copper and copper oxide have no catalytic activities. Examples of the reducing agent to which copper and copper oxide have no catalytic activities include hypophosphites such as sodium hypophosphite.

Thus, by performing the first step and the second step on the copper foil, a composite copper foil with protrusions on its surface can be manufactured. Ra of the protrusions is not particularly limited, but is preferably 0.02 μm or more, more preferably 0.04 μm or more and preferably 0.20 μm or less, and more preferably 0.05 μm or less. It is easy for those skilled in the art to set conditions such as the temperature and time so that such copper oxide can be obtained.

The copper foil manufactured in these steps may be subjected to a coupling treatment using a silane coupling agent or an anti-rust treatment using benzotriazoles.

Further, an adhesive layer may be made between the copper foil manufactured in these steps and the pre-preg. The method for making the adhesive layer is not limited, but may be the lamination of an adhesive resin film or the application of a resin varnish.

EXAMPLES

In Examples and Comparative Example 1, DR-WS copper foils (manufactured by Furukawa Electric Co., Ltd. with a thickness of 18 μm) were used, and their shiny faces (a glossy surface, which is the flatter surface when compared with the opposite side) were plated. In Comparative Example 2, the mat surface of an electrolytic copper foil F2-WS (Furukawa Electric Co., Ltd. with a thickness of 18 μm) was used. Details of the process are described below.

(1) Alkaline Treatment

Preconditioning was performed with 1.2 g/L of a sodium hydroxide aqueous solution at 40° C. for 1 minute. The purpose of this procedure is degreasing and cleaning for the purpose of reducing the unevenness of oxidation. In Comparative Example 2, no alkaline treatment was performed.

(2) Oxidation

Each copper foil treated with alkali was oxidized using an aqueous oxidation solution (130 g/L of $NaClO_2$ and 12 g/L of NaOH) at 45° C. for 1 minute. In Comparative Example 2, no oxidation was performed. After these treatments, the copper foils were rinsed with water.

(3) Plating

For the oxidized copper foils, electrolytic plating was performed using an electrolytic solution for nickel plating (470 g/L of nickel sulfamate and 40 g/L of boric acid) in Examples 1 to 3. In Example 5, the electrolytic plating was performed using an electrolytic solution for chromium plating (100 g/L of chromic anhydride and 1 g/L of sulfuric acid). In Example 6, the electrolytic plating was performed using an electrolytic solution for zinc plating (10 g/L of zinc oxide, 115 g/L of sodium hydroxide, 5 ml/L of 9500A (manufactured by NIPPON HYOMEN KAGAKU KABUSHIKI KAISHA), 0.5 ml/L of 9500B (manufactured by NIPPON HYOMEN KAGAKU KABUSHIKI KAISHA), and 10 ml/L of Hypersoft (manufactured by NIPPON HYOMEN KAGAKU KABUSHIKI KAISHA)). Conditions such as the temperature, time, and current density are as shown in Table 1. In Comparative Example 1, no plating was performed. In Example 4, the copper foil was treated using a sensitizing solution (1.0 g/L of tin chloride and from 0.5 to 3.0 mL/L of hydrochloric acid) at 30° C. for 1 minute and then an activation solution (100 mg/L of palladium chloride and 0.1 mL of hydrochloric acid) at 30° C. for 1 minute; then, it was electroless-plated at 90° C. for 5 seconds using a Ni—P plating solution (BLUE SUMER, Japan Kanigen Co., Ltd.).

In Example 7, the copper foil obtained in Example 2 was immersed in a 1 wt % aqueous solution of a silane coupling agent (KBM-803 manufactured by Shin-Etsu Chemical Co., Ltd.) at room temperature for 1 minute, and then it was dried in a dryer at 70° C. for 1 minute. The copper foils thus produced were used.

TABLE 1

| Conditions of electrolysis | | Examples 1 | 2 | 3 | 5 | 6 | 7 | 8 |
|---|---|---|---|---|---|---|---|---|
| Temperature | ° C. | 50 | 50 | 50 | 40 | 20 | 50 | 50 |
| Time | sec | 30 | 15 | 15 | 60 | 45 | 15 | 30 |
| Current density | A/dm2 | 0.5 | 1 | 2 | 20 | 0.5 | 1 | 0.5 |
| Coulomb | C | 15 | 15 | 30 | 1200 | 22.5 | 15 | 15 |

(4) Measurement of Heights of Protrusions, Number of Protrusions, and Surface Roughness The heights of protrusions, the number of protrusions, and the surface roughness of the composite copper foils obtained in Examples 1 to 6 and Comparative Examples 1 and 2 were measured. Specifically, a confocal scanning electron microscope controller MC-1000A (manufactured by Lasertec Corporation) was used for the measurements. In scanning electron microscope (SEM) images, the distance between the midpoint of the line segment connecting the lowest points of depressions adjacent to a given protrusion and the highest point of that protrusion between the depressions was defined as the height of the protrusion. Using SEM images for five sites apart from each other, an average of the heights measured at three different locations per image was calculated as the average height of the protrusions. Next, in the five SEM images, the number of protrusions with a height of 50 nm or higher was counted per a 3.8-μm range, and their average were calculated for the five images. The surface roughness was calculated as an arithmetic average roughness (Ra). FIG. 1 shows the observation results with the scanning electron microscope, and Table 2 shows the measurement results. The lower the Ra value is, the smaller the surface roughness of the copper foil surface is.

(5) Measurement of the Weight of Metals Other than Cu

For the plated copper foils of Examples 1 to 6, the weight of metal other than Cu was measured. Specifically, the plated copper foils and the non-plated copper foils were cut into 3 cm square pieces and dissolved in a 12% nitric acid aqueous solution. Then, the weight of metals per one side of each copper foil was measured by high frequency inductively coupled plasma (ICP) analysis. The difference between them was defined as the weight of metal other than Cu. The results are shown in Table 2.

(6) Measurement of Property of Tight Adhesion I—Measurement of Peel Strength

For the copper foils of Examples 1 to 7 and Comparative Examples 1 and 2, their peel strengths after lamination and after heat treatment were measured. First, a pre-preg (R5670KJ (manufactured by Panasonic Corporation)) was laminated on the copper foils and measurement samples (Initial) were obtained by keeping them in a vacuum at 210° C. for 30 minutes using a high-pressure vacuum press. In order to examine the heat resistance, the samples were placed in an oven at 177° C. for 10 days to obtain the measurement samples for heat resistance tests. The peel strengths (kgf/cm) of these measurement samples were measured using a 90° peel test (JIS C5016). In Example 8, an adhesive film (NC0207 manufactured by NAMICS Corporation), which is mainly composed of a phenylene ether oligomer and elastomer, was sandwiched as an adhesive resin layer between the copper foil obtained in Example 2 and a pre-preg and the laminate was kept in vacuum at 210° C. for 30 minutes using a high-pressure vacuum press to obtain a measurement sample (referred to as "Initial"). Its peel strength after the heat treatment was measured under the same conditions. A higher peel strength indicates a tighter adhesion between the copper foil and the pre-preg. The results are shown in Table 3.

Decrease rate of thermal resistance was calculated using the following formula.

$$\text{Decrease rate of thermal resistance }(\%)=100-((\text{Peel strength after heat resistance test}/\text{Peel strength of the Initial})\times 100)$$

(7) Measurement of Property of Tight Adhesion II—Determination of Seepage

In order to examine the acid resistance of the copper foils in Examples 1 to 6 and Comparative Examples 1 and 2, the copper foils after lamination were immersed in an HCl aqueous solution (4N) at 60° C. for 90 minutes to obtain measurement samples, and they were subjected to a 90° peel test (Japanese Industrial Standard (JIS) C5016). The adhesive surfaces on copper foils were examined for change in color due to seepage. The results are shown in Table 3.

(8) Results peel strength were at a satisfactory level; however, there was seepage after the acid resistance test and the decrease rate of thermal resistance was high.

On the other hand, in Examples 1 to 6 where oxidation and plating with appropriate strengths were performed, all factors were satisfactory regardless of the plating method and the type of coating metal. Plating is thought to increase the adhesion. In Example 1, the performance has no problem as shown in Table 3 even though no protrusions and depressions were observed as shown in Table 2.

In addition, even if the manufactured copper foil was subjected to a coupling treatment as shown in Example 7 and an adhesive layer was used between the manufactured copper foil and the pre-preg as shown in Example 8, the performance of the copper foils has no problems as shown in Table 3.

Thus, by plating after surface roughening by oxidation, copper foils with excellent properties for peel strength, a seepage after acid resistance test, and decrease rate of thermal resistance can be produced. These composite copper foils can appropriately be used for printed wiring boards.

INDUSTRIAL APPLICABILITY

The present invention made it possible to provide novel composite copper foils.

The invention claimed is:

1. A composite copper foil comprising a copper foil and a layer of metal other than copper, the metal layer being formed on at least a part of a surface of the copper foil, wherein

TABLE 2

| | | Examples | | | | | | | | Comparative Examples | |
|---|---|---|---|---|---|---|---|---|---|---|---|
| | | 1 | 2 | 3 | 4 | 5 | 6 | 7 | 8 | 1 | 2 |
| Oxidation | | Yes | Yes | Yes | Yes | Yes | Yes | Yes | Yes | Yes | No |
| Plating | | Electrolytic | Electrolytic | Electrolytic | Electroless | Electrolytic | Electrolytic | Electrolytic | Electrolytic | None | None |
| Protrusions | Average height (nm) | — | 109 | 118 | 102 | 125 | 140 | 109 | 109 | 85 | 1654 |
| | Number | — | 42 | 46 | 31 | 17 | 37 | 42 | 42 | 37 | 5 |
| Surface roughness | Ra (μm) | 0.05 | 0.05 | 0.04 | 0.05 | 0.04 | 0.07 | — | — | 0.06 | 0.34 |
| Amount of metals other than Cu | ICP (ppm) | 23 | 20 | 45 | 9 | 20 | 27 | 20 | — | — | — |

TABLE 3

| | Examples | | | | | | | | Comparative Examples | |
|---|---|---|---|---|---|---|---|---|---|---|
| | 1 | 2 | 3 | 4 | 5 | 6 | 7 | 8 | 1 | 2 |
| Initial (kgf/cm) | 0.23 | 0.28 | 0.16 | 0.21 | 0.22 | 0.14 | 0.40 | 0.51 | 0.31 | 0.51 |
| Heat resistance test (kgf/cm) | 0.17 | 0.26 | 0.16 | 0.18 | 0.16 | 0.18 | 0.38 | 0.50 | 0.16 | 0.49 |
| Decrease rate of thermal resistance (%) | 28 | 6 | 2 | 16 | 27 | −22 | 5 | 2 | 47 | 4 |
| Seepage | No | No | No | No | No | No | No | No | Yes | No |

In Comparative Example 2 where neither oxidation nor plating was performed, the protrusions were extremely high, and the surface roughness was remarkably significant. In Comparative Example 1 where only oxidation was performed with no plating, both the surface roughness and the at least a part of the composite copper foil has protrusions on a surface thereof, each protrusion has a height of 10 nm or more but 1000 nm or less in a cross-section of the composite copper foil, the metal layer is formed on at least a part of a surface of the protrusions of the copper foil, a number of protrusions with a height of 50 nm or more is, on average, 15 or more and 100 or less per a 3.8-μm range of a cross-section of the composite copper foil, and arithmetic average roughness (Ra) of the protrusions is 0.02 μm or more and 0.20 μm or less.

2. The composite copper foil according to claim 1, wherein a percentage of Cu relative to the total weight of Cu and the metal other than Cu at a depth of 6 nm in the composite foil is 80% or less and a percentage of Cu relative to the total weight of Cu and the metal other than Cu at a depth with no oxygen is 90% or more.

3. The composite copper foil according to claim 2, wherein each protrusion has a height of 50 nm or more but 500 nm or less.

4. The composite copper foil according to claim 2, wherein the layer of metal is a uniform layer with no particles.

5. The composite copper foil according to claim 2, wherein a Cu/O ratio at a depth where the atomic percentage of Cu is 40% is 0.9 or more.

6. The composite copper foil according to claim 1, wherein each protrusion has a height of 50 nm or more but 500 nm or less.

7. The composite copper foil according to claim 1, wherein the height of each protrusion is measured as a distance between a midpoint of a line segment connecting the lowest points of depressions on both sides of a given protrusion and the highest point of the protrusion, in a scanning electron microscope image of a cross-section.

8. The composite copper foil according to claim 1, wherein the layer of metal is a uniform layer with no particles.

9. The composite copper foil according to claim 1, wherein a Cu/O ratio at a depth where the atomic percentage of Cu is 40% is 0.9 or more.

10. The composite copper foil according to claim 1, wherein the metal other than copper is at least one metal selected from the group consisting of Sn, Ag, Zn, Al, Ti, Bi, Cr, Fe, Co, Ni, Pd, Au, and Pt.

* * * * *